(12) United States Patent
Kamikawa et al.

(10) Patent No.: US 7,940,003 B2
(45) Date of Patent: May 10, 2011

(54) LIGHT EMITTING DEVICE AND METHOD OF FABRICATING A LIGHT EMITTING DEVICE

(75) Inventors: Takeshi Kamikawa, Mihara (JP); Yoshinobu Kawaguchi, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 237 days.

(21) Appl. No.: 12/155,978

(22) Filed: Jun. 12, 2008

(65) Prior Publication Data

US 2008/0309218 A1 Dec. 18, 2008

(30) Foreign Application Priority Data

Jun. 13, 2007 (JP) .................. 2007-156453
Mar. 24, 2008 (JP) .................. 2008-075804

(51) Int. Cl.
*H05B 33/00* (2006.01)

(52) U.S. Cl. ........... 313/512; 313/506; 362/800; 257/13

(58) Field of Classification Search .................. None
See application file for complete search history.

(56) References Cited

U.S. PATENT DOCUMENTS

| 6,417,019 | B1 | 7/2002 | Mueller et al. | |
|---|---|---|---|---|
| 6,642,652 | B2* | 11/2003 | Collins et al. | 313/512 |
| 6,991,952 | B2 | 1/2006 | Mizuno et al. | |
| 7,110,425 | B2 | 9/2006 | Yamanaka et al. | |
| 2002/0084749 | A1* | 7/2002 | Ayala et al. | 313/512 |
| 2003/0030053 | A1 | 2/2003 | Kawakami et al. | |
| 2005/0001532 | A1* | 1/2005 | Srivastava et al. | 313/484 |
| 2005/0242359 | A1 | 11/2005 | Yoshida et al. | |
| 2007/0080368 | A1 | 4/2007 | Kamikawa et al. | |

FOREIGN PATENT DOCUMENTS

| JP | 2003-017791 | 1/2003 |
|---|---|---|
| JP | 2004-014820 | 1/2004 |
| JP | 2004-040051 | 2/2004 |
| JP | 2004-289010 | 10/2004 |

* cited by examiner

*Primary Examiner* — Ashok Patel

(74) *Attorney, Agent, or Firm* — Harness, Dickey & Pierce, P.L.C.

(57) ABSTRACT

The present invention comprises a light absorption film 5 which is formed on the outermost surface of an end surface on the light emitting side of a chip used in a laser device, typically, a laser chip 1 and which absorbs part of the light emitted. By forming this light absorption film 5, the collection and accumulation of pollutants which are caused by reacting with light emitted are curbed.

24 Claims, 8 Drawing Sheets

Fig.9 Conventional Art
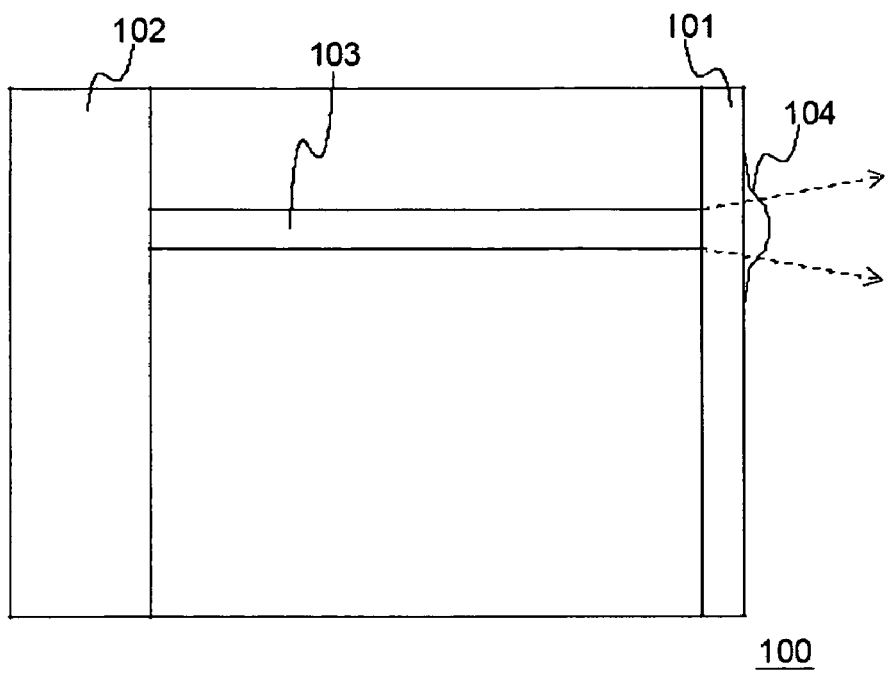
Fig.10 Conventional Art
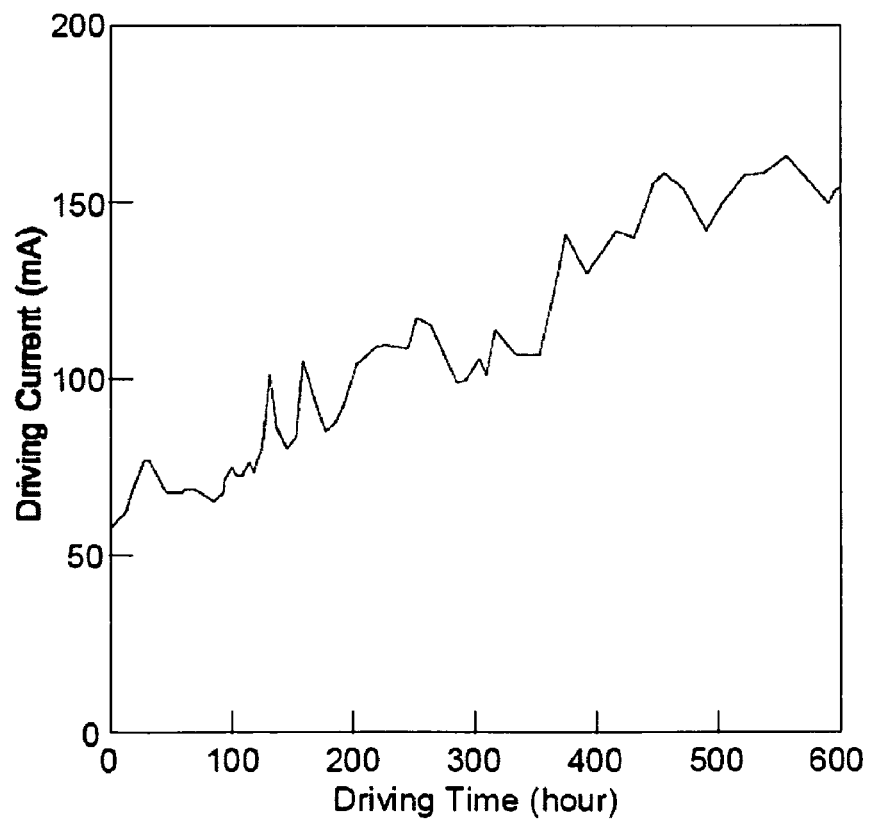

US 7,940,003 B2

LIGHT EMITTING DEVICE AND METHOD OF FABRICATING A LIGHT EMITTING DEVICE

This nonprovisional application claims priority under 35 U.S.C. §119(a) on Patent Application No. 2007-156453 filed in Japan on Jun. 13, 2007 and No. 2008-075804 filed in Japan on Mar. 24, 2008, the entire contents of which are hereby incorporated by reference.

BACKGROUND OF THE INVENTION

1. Field of the Invention

The present invention relates to a light emitting device and a method of fabricating a light emitting device, and more particularly, to a semiconductor light emitting device having a short luminous wavelength, typically a nitride semiconductor laser device and a fabricating method thereof.

2. Description of Related Art

Because of their band structure and chemical stability, nitride semiconductors (e.g., AlN, GaN, InN, or the like, or solid solutions of them such as AlGaN, InGaN, or the like are included. They are collectively called nitride semiconductors in this application.) that are compounds of Al, Ga, In, or the like, which are group III elements, and N, which is a group V element are expected to be applied as materials for light emitting devices or power devices, and applications of these nitride semiconductors to light sources of information recording apparatuses are also attracting attention A laser chip which is made of such a nitride semiconductor and used for a laser device is obtained by cleaving and dividing a wafer that is formed by laminating nitride semiconductor layers and an electrode on a substrate. And, formed on an end surface obtained by cleaving a wafer, especially on the light-emitting side end surface, is a protection film (low-reflectance film) which has a single layer of a material (e.g., $SiO_2$ or $Al_2O_3$ or the like) transparent to light or a small number of layers obtained by combining such a single layer. On the other hand, formed on the end surface opposite to the light-emitting side end surface is a large-reflectance protection film (high-reflectance film) which includes a multi-layer lamination of $Al_2O_3$ and $Ta_2O_5$, and the like. With such protection films formed, the reflectance is adjusted to allow an efficient light emission, and the change of properties of the end surface caused by chemical reactions such as oxidation or the like is prevented.

However, there is a problem that such a protection film collects and accumulates pollutants thereon, and the problem is especially notable in light emitting devices that emit light having a short wavelength of 500 nm or less. This problem is caused because siloxane having a combination of Si and O, and hydrocarbon compounds or the like present near the chip of a light emitting device are polymerized by the short-wavelength light emitted from the chip, and adhere to and accumulate on the protection film, which has also been the problem with the light emitting devices which use the above-mentioned nitride semiconductors and emit light having the short wavelength.

This problem that the chip collects and accumulates pollutants thereon is explained based on a schematic side view of a laser chip shown in FIG. 9. A laser chip 100 shown in FIG. 9 has the above-described low-reflectance film 101 and high-reflectance films 102 as the protection films, and the light emitted from an active layer 103 at the end surface on the light emitting side of the laser chip 100 travels through the low-reflectance film 101 and is directed in the direction substantially perpendicular to the end surface as shown by broken lines. At this time, a pollutant 104 reacts with the light emitted, collects and accumulates on the low-reflectance film to absorb the light emitted. Accordingly, it becomes necessary to increase the driving current to maintain the emission amount of light. Such increase of the driving current shortens the device life and brings the instability of operation of the light emitting device.

As a specific example of this, a result of the performance test of a laser device having the laser chip 100 shown in FIG. 9 is illustrated in FIG. 10. FIG. 10 is a graph when the driving current was so controlled as to maintain the optical output at 15 mW and the temperature at 75° C. in a continuous oscillation of the laser device having an oscillation wavelength of 405 nm. As shown in FIG. 10, because the pollutant 104 in the atmosphere gradually collects and accumulates thick after the oscillation begins, the driving current increases as the driving time passes. Specifically, the current value is about 60 mA immediately after the beginning of the operation, but increases to about 150 mA, that is, more than twofold in 500 hours of the driving time. Besides, the driving current fluctuates up and down in units of dozens of milliamperes, and the drive operation is unstable.

To prevent this problem, taking a can package as an example, a method of curbing the invasion of pollutants by sealing the chip air-tightly with a cap and controlling the ambience sealed air-tightly has been proposed (see patent document 1). Besides, a method of removing pollutants by plasma cleaning before the air-tight sealing, and a method of removing pollutants with the aid of adsorbent placed in the package sealed air-tightly to adsorb pollutants have also been proposed (see patent documents 2 and 3).

[patent document 1] JP-A-2004-289010
[patent document 2] JP-A-2004-040051
[patent document 3] JP-A-2004-014820

However, these methods require not only a strict control over the ambience sealed air-tightly but also a structure for the air-tight sealing, which makes the light emitting device bulky. Therefore, it is difficult to use the device in light sources for information recording apparatuses, typically, optical pickups for CDs (compact disk) and DVDs (digital versatile disk) because of the bulky size of the light emitting device. Although a light emitting device having a frame package that does not need the air-tight sealing can be easily applied to an optical pickup, the pollutant 104 collects and accumulates as the service time passes as shown in FIG. 9, which shortens the device life and brings an unstable operation of the device.

Moreover, even if a type of package in which the chip is sealed air-tightly, because organic adhesives such as Ag paste, silicon based-, or epoxy based-adhesives need to be used in the package, the contents of these adhesives volatilize and become pollutants. It is possible to prevent pollutants from collecting and accumulating to some extent by removing them with radiation of plasma or the like before the air-tight sealing, or by performing the air-tight sealing in a dried air having a dew point of −15° C. or lower, but because the plasma radiation and a strict control over the sealed ambience are required, the fabrication processes become cumbersome. In addition, because pollutants are volatilized into the sealed ambience by the heat generated during the device operation, it is difficult to prevent perfectly the pollutants from collecting and accumulating. Besides, because a process for confirming whether or not the air-tight sealing is surely carried out is necessary, and because the light emitting devices that are not surely sealed air-tightly must be disposed of as wastes, the yield is lowered.

SUMMARY OF THE INVENTION

To cope with the conventional problems mentioned above, it is an object of the present invention to provide a light emitting device that lessens the pollutants collecting and accumulating on the chip, has a long life and a stable operation, does not require a structure to be sealed air-tightly, and allows an easy air-tight sealing without a strict control, and to provide a method of fabricating the device.

To achieve the above objects, a light emitting device according to one aspect of the invention comprises:

a chip for emitting light; and a light absorption film formed on the outermost surface of the end through which light from the chip is emitted to absorb part of the light emitted.

A method of fabricating a light emitting device according to one aspect of the invention comprises the steps of:

a first step in which a protection film is formed on the portion to be the end surface through which laser light from a laser chip is emitted to protect the end surface; and a second step in which after the first step, a light absorption film is formed on the surface of the protection film to absorb part of the laser light emitted from the laser chip.

Besides, a light emitting device according to another aspect of the invention comprises:

a laser chip for emitting light;

a metal film made of metal and formed on the outermost surface of an end of the chip through which light from the chip is emitted.

According to the structure of the invention, because a light absorption film is formed on the end through which light is emitted to absorb part of the light emitted, it is possible to curb the collection and accumulation of pollutants on the light absorption film, that is, the end through which light from the light emitting device is emitted. Accordingly, it is possible to prevent the reduction of optical output of the emitted light caused by the collection and accumulation of such pollutants. Moreover, because it is not necessary to increase the driving current to keep the optical output, the life of the light emitting device can be prolonged.

BRIEF DESCRIPTION OF THE DRAWINGS

FIG. 9 is a schematic side view of a conventional laser chip;

FIG. 10 is a graph showing a result of a performance test of the conventional laser device;

DETAILED DESCRIPTION OF PREFERRED EMBODIMENTS

Hereinafter, embodiments of the present invention will be described based on FIGS. 1 to 8. To begin with, a basic structure of the present invention is described and various embodiments are described afterwards.

Figure 1:
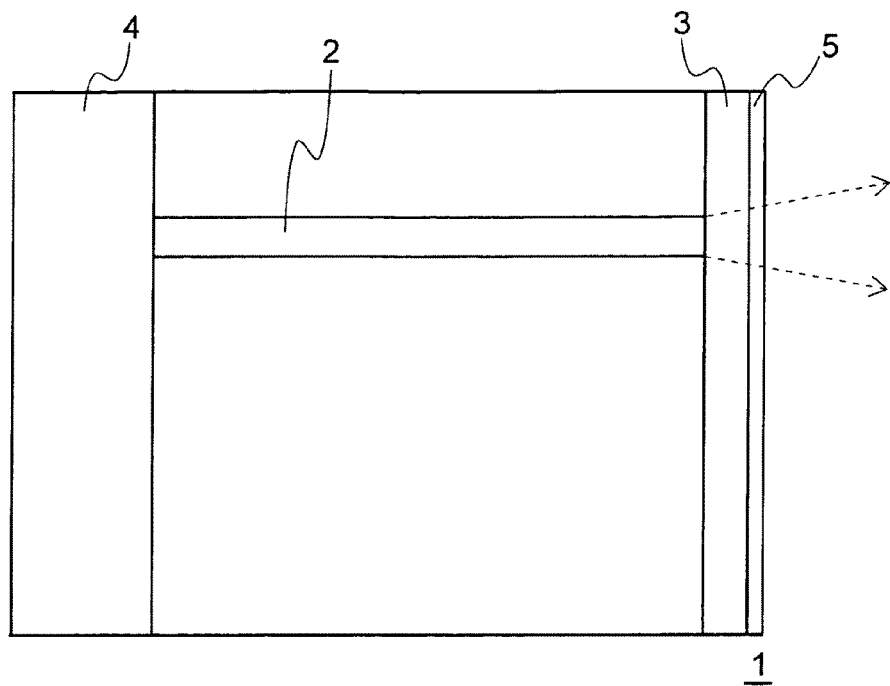
FIG. 1 is a schematic side view of a laser chip according to an embodiment of the present invention.

Basic Structure: A basic structure of the present invention is explained using FIG. 1. FIG. 1 is a schematic side view showing a structure example of a laser chip according to the present invention and corresponds to FIG. 9 showing a structure of the conventional laser chip.

As shown in FIG. 1, in the present invention, a low-reflectance film 3 is formed on the end surface on the light emitting side of a laser chip 1 through an active layer 2 of which laser light is emitted, and a high-reflectance film 4 is formed on the end surface opposite to the end surface on the light emitting side, and in particular, a light absorption film 5 is formed on the surface of the low-reflectance film 3 formed on the end surface on the light emitting side. Conventionally, not to reduce the light amount emitted, the low-reflectance film 3 made of only a material transparent to the light was formed on the end surface on the light emitting side. In the present invention, however, formed on the surface of the low-reflectance film 3 is the light absorption film 5 made of a material which is not transparent to the light emitted.

For example, films possible to be used as the light absorption film 5 are as follows: a metal film containing gold (Au), platinum (Pt), rhodium (Rh), iridium (Ir), osmium (Os), ruthenium (Ru), palladium (Pd), or the like; a nitride film containing a nitride of aluminum (Al), titanium (Ti), zirconium (Zr), yttrium (Y), silicon (Si), niobium (Nb), hafnium (Hf), tungsten (W), tantalum (Ta), or the like; further, an oxygen depleted film which is an oxide of aluminum (Al), titanium (Ti), zirconium (Zr), yttrium (Y), silicon (Si), niobium (Nb), hafnium (Hf), tungsten (W), tantalum (Ta), or the like and whose composition deviates in the direction from its stoichiometric composition to the composition in which the oxygen becomes less.

Figure 2:
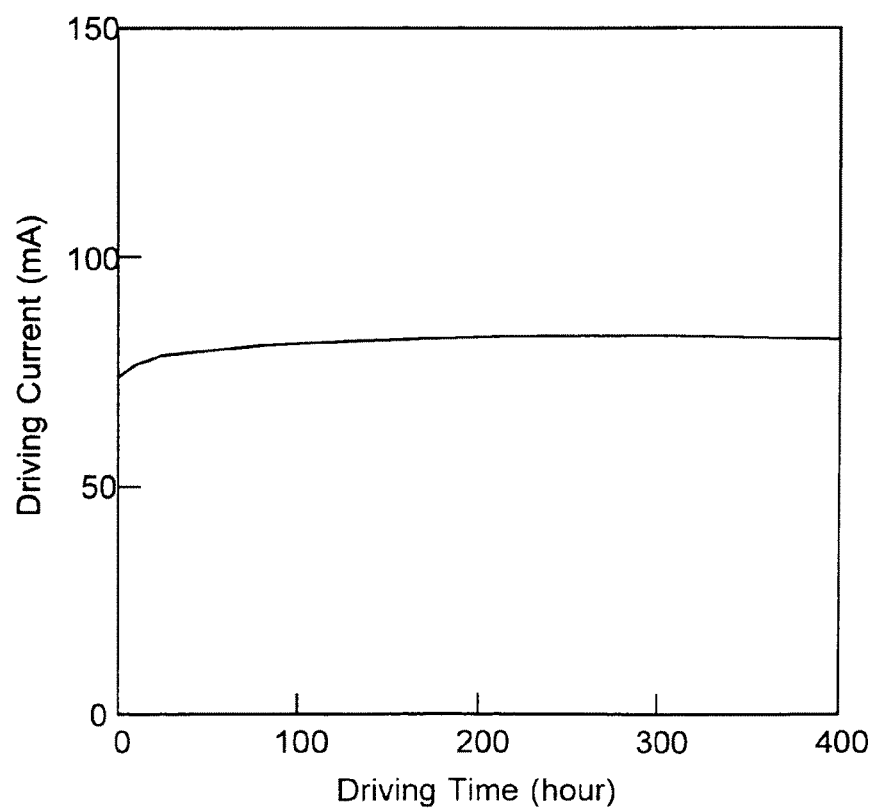
FIG. 2 is a graph showing a result of a performance test of a laser device according to an embodiment of the present invention.

Next, an operation example of a laser device having a laser chip in which the light absorption film 5 is formed is explained using FIG. 2. FIG. 2 is a graph showing a result of a performance test of a laser device having the laser chip 1 which has the structure shown in FIG. 1, and corresponds to FIG. 10 showing the result of the performance test of the conventional laser device. Besides, FIG. 2 is a graph in a case where the driving current was so controlled as to maintain the optical output at 20 mW and the temperature at 75° C. in a continuous oscillation of a laser device having an oscillation wavelength of 405 nm in an atmospheric ambience, where the laser chip 1 is not sealed air-tightly.

As shown in FIG. 2, by forming the light absorption film 5 on the surface of the low-reflectance film 3, it is possible to curb the increase in the driving current depending on the lapse of the driving time, and also possible to stabilize the driving current. In this embodiment, despite the condition where the optical output is set so larger than 15 mW in FIG. 10 as to allow easy reaction of pollutants, the driving current does not fluctuate so much form the beginning of the oscillation, that is, is constant and stable at about 80 mA.

This can be understood that part of the light emitted is absorbed by the light absorption film 5 and thereby heat is generated, and pollutants are evaporated again by the heat, or they are prevented from collecting, and thus the collection and accumulation of pollutants are curbed. By curbing the collection and accumulation of pollutants, even after a long-time driving of the laser device, it is possible to prevent the increase in the driving current due to the reduction of the light amount, and to prolong the life of the laser device.

Besides, by forming the light absorption film 5 in the laser chip 1, even if it is mounted in various packages without sealing it air-tightly, it is possible to suppress the increase of the driving current due to the lapse of the driving time. And a laser device which emits short-wavelength light can also be packaged without the air-tight sealing, and thus the laser device can be made compact. Further, even if a package that needs the air-tight sealing is employed, because a strict control over the sealing conditions such as a dew point and the like is not necessary, it is possible to make easily a laser device.

Specific structures and effects of the laser chip in which the light absorption film 5 is formed are described in detail in the embodiments explained later. In addition, the material of the light absorption film 5 described above is an example, and other materials can be used for the light absorption film 5. And the light absorption film 5 may be a multi-layer film.

The present invention can be applied to general light emitting devices which emit light of a short wavelength, and besides laser chip 1, may also be applied to chips of light emitting devices, for example, light emitting diodes, super-luminescence diodes or the like. Moreover, when applied to laser chips, the present invention may be applied not only to edge emitting laser chips which emit light from the end surface (which is perpendicular to the grown surface of each layer on the substrate) as described above but also to surface emitting laser chips which emit light from the surface (which is parallel to the grown surface of each layer on the substrate). In both cases of the edge emitting laser chips and the surface emitting laser chips, by forming the light absorption film 5 on the outermost surface of the end through which light is emitted, it is possible to prevent pollutants from collecting and accumulating on the outermost surface.

The present invention may also be applied to chips which have a plurality of devices and emit light of a short wavelength. For example, it may be applied to hologram laser devices having a laser chip together with an optical device such as a hologram device and a light receiving device or the like, or to chips used for light emitting devices which are composed of a chip for emitting light of a short wavelength and a fluorescent plate and emit light having a plurality of wavelengths like white light.

Besides nitride semiconductors, the present invention can be applied to light emitting devices made of a material which emits light of a short wavelength. For example, the present invention may be applied to light emitting devices made of a ZnSe-based or ZnO-based material.

Figure 3:
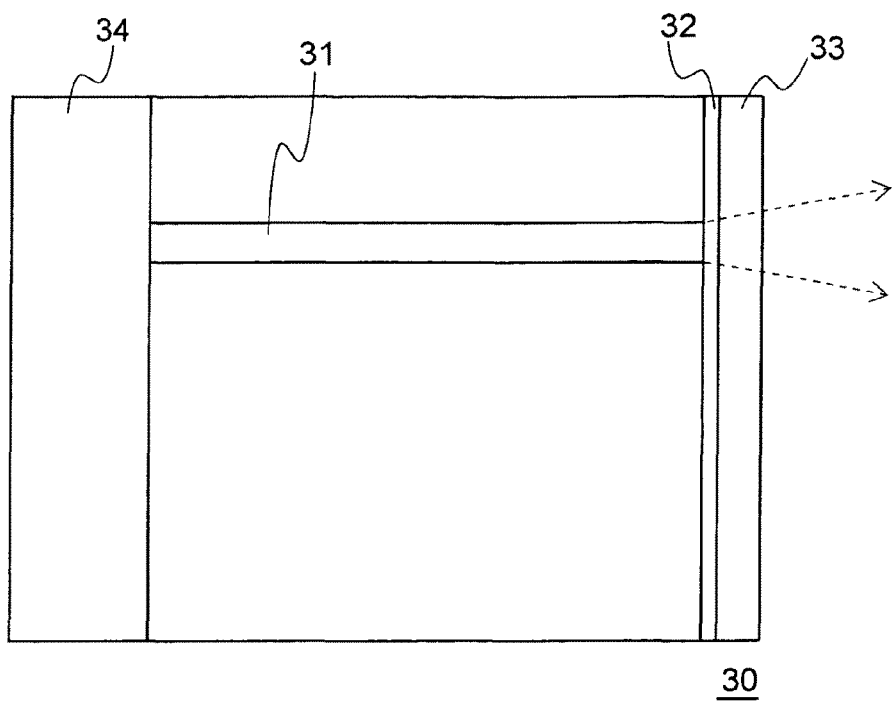
FIG. 3 is a schematic side view of a laser chip having an AlN film.
Figure 4:
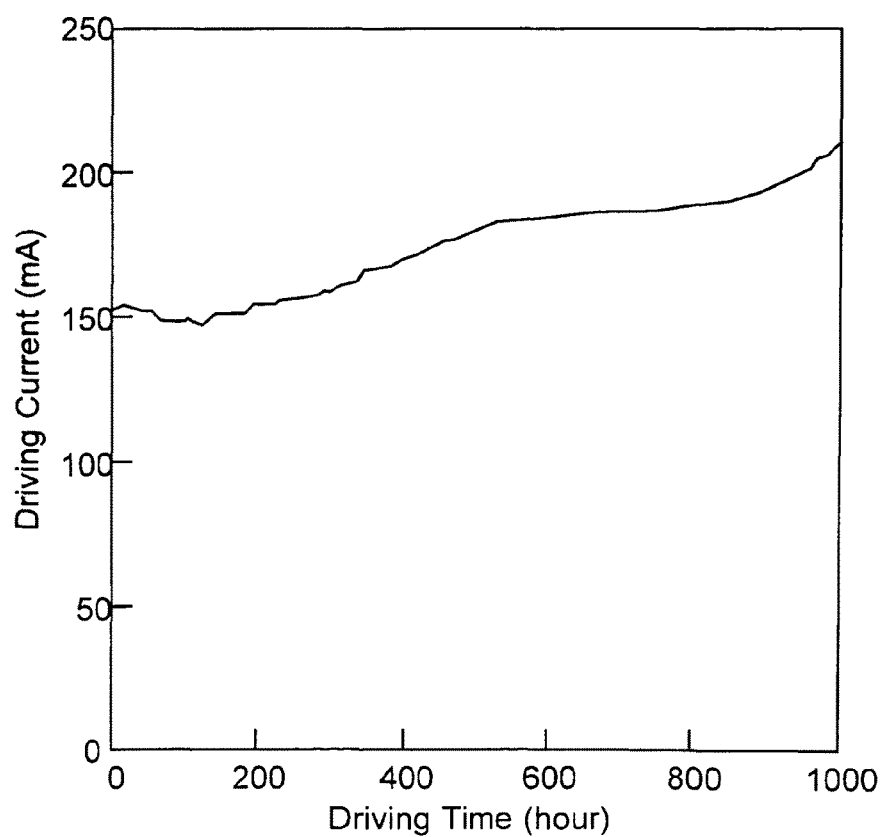
FIG. 4 is a graph showing a result of a performance test of a laser device having the laser chip shown in FIG. 3.

In addition, a semiconductor film of the hexagonal system such as an AlN film or the like may be formed directly on the end surface. With such a structure, an effect that the protection film is so adhered as to be prevented from peeling off, and an effect that the device operation becomes stable at a high output because the end surface is securely protected by the tight adhesion of the protection film can be obtained. These effects are described using the graph in FIG. 4. FIG. 4 shows a result of a performance test of a laser device which has a laser chip 30 having a structure in which an AlN film 32 shown in FIG. 3 is formed on the end surface on the light emitting side, and then a low-reflectance film 33 made of $Al_2O_3$ is formed on the film 32. FIG. 4 is a graph in a case where the driving current was so controlled as to maintain the optical output at 15 mW and the temperature at 75° C. in a continuous oscillation of a laser device having an oscillation wavelength of 437 nm in an atmospheric ambience, without sealing it air-tightly.

As shown in FIG. 4, the laser chip 30 on the end surface of which the AlN film is formed can operate stably for longer than 1000 hours without being damaged even if the driving current exceeds 150 mA at an optical output of 15 mW, provided, as shown in FIG. 3, because this laser chip 30 is not provided with the light absorption film 5 shown in FIG. 1 to distinguish its effect from that of the present invention, the driving current increases as the driving time passes. Specifically, the riving current increases by a so large amount of 30 mA in 500 hours after the beginning of the oscillation. However, if the light absorption film 5 according to the present invention is formed on the surface of the low-reflectance film 33 in the structure shown in FIG. 3, it is possible to prevent the increase in the driving current depending on the lapse of the driving time as shown in FIG. 2.

Moreover, when a light emitting device is structured so that the reflectance of the high-reflectance film 4 shown in FIG. 1 is lowered to let a small amount of light emit through the high-reflectance film 4, and the driving current is controlled by feeding back a control signal based on the small amount of light emitted, the light absorption film 5 may be formed on the surface of the high-reflectance film 4.

With such structure, because pollutants are prevented from collecting and accumulating on the surface of the high-reflectance film 4, the optical output to generate a control signal can be made accurate. Therefore, it is possible to prevent the misunderstanding that weak light emitted through the high-reflectance film 4 is due to weak output light from the light emitting device even if it is because of the collection and accumulation of pollutants, and thus prevent an excessively large current from being supplied to the light emitting device.

In a case where a metal film is used as the light absorption film 5, if the metal film is formed directly on the end surface, the current is shunted via the metal film and cannot flow into the active layer. Besides, if the film is made of a metal or not, heat generated from the light absorption film 5 can damage the end surface, and therefore, it is not preferable that the light absorption film 5 is formed near the end surface. Moreover, because the places on which pollutants collect are the surfaces of the protection films 3, 4, the light absorption film 5 is preferably formed near the surfaces of the protection films rather than near the end surface to prevent the collection and accumulation of more pollutants.

EMBODIMENTS

Next, embodiments of the present invention having the above-described basic structure are explained. Each embodiment is only an example, and the present invention may have any structure as long as the light absorption film is formed on the outermost surface of the end through which light is emitted as described above.

First Embodiment

Figure 5A:
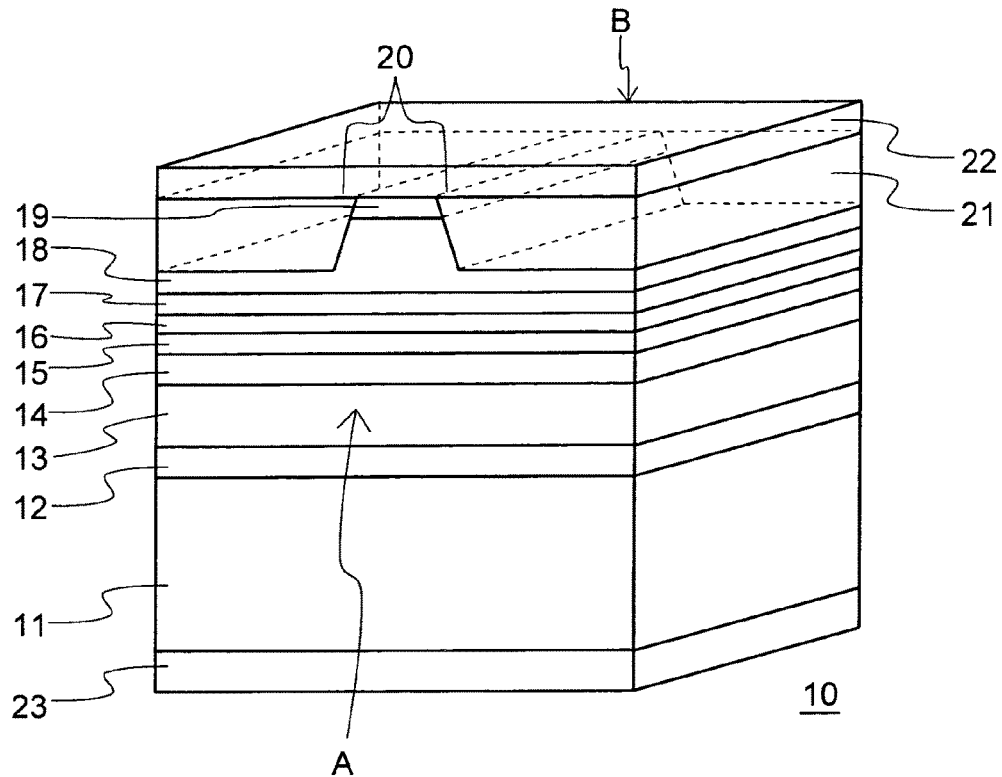
FIG. 5A is a schematic perspective view of a laser chip according to a first embodiment of the present invention.
Figure 5B:
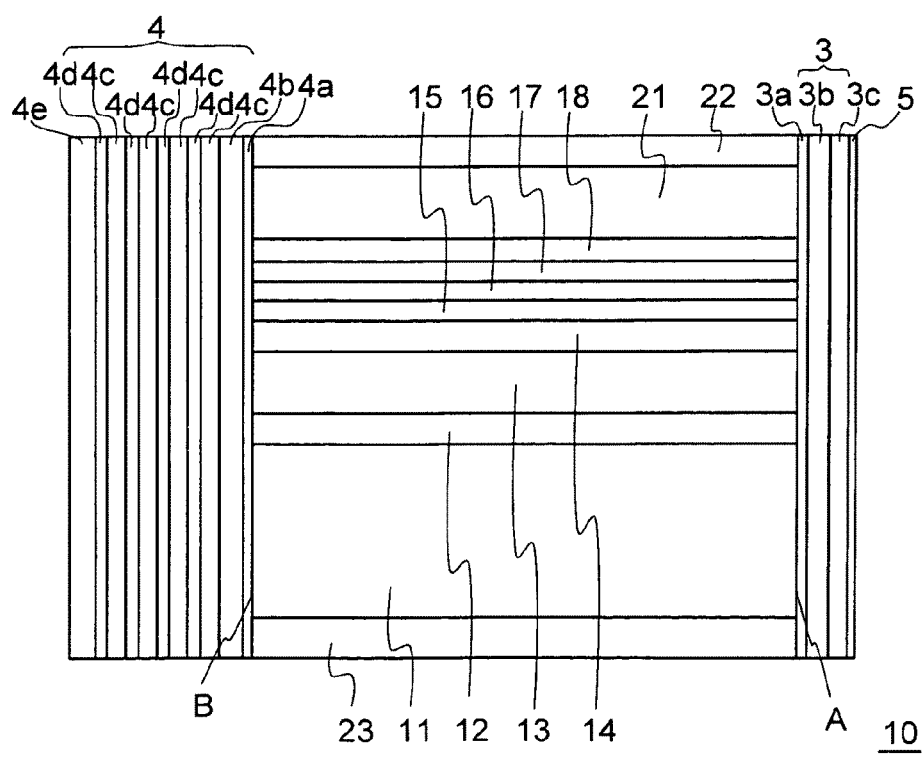
FIG. 5B is a schematic side view of the laser chip according to the first embodiment of the present invention.

To begin with, the first embodiment is described using FIGS. 5A and 5B. FIG. 5A is a schematic perspective view showing a structure example of a laser chip according to the first embodiment. FIG. 5B is a schematic sectional view of the structure example of the laser chip according to the first embodiment. As shown in the perspective view of FIG. 5A, the laser chip 10 according to the present embodiment has: a buffer layer 12 laminated on an n-type GaN substrate 11 and composed of n-type GaN having a thickness of 0.2 μm; an n-type clad layer 13 laminated on the buffer layer 12 and composed of n-type $Al_{0.06}Ga_{0.94}N$ having a thickness of 2.3 μm; an n-type guide layer 14 laminated on the n-type clad layer 13 and composed of n-type GaN having a thickness of 20 nm; a multi-quantum well active layer 15 composed of InGaN having a thickness of 4 nm and GaN having a thickness of 8 nm laminated alternately as GaN/InGaN/GaN/InGaN/GaN/InGaN/GaN on the n-type guide layer; a protection layer 16 laminated on the multi-quantum well active layer 15 and composed of GaN having a thickness of 70 nm; a current block layer 17 laminated on the protection layer 16 and composed of p-type $Al_{0.3}Ga_{0.7}N$ having a thickness of 20 nm; a p-type clad layer 18 laminated on the current block layer 17 and composed of p-type $Al_{0.05}Ga_{0.95}N$ the upper part of which has a stripe shape extending in a given direction; and a p-type contact layer 19 laminated on the stripe-shaped part of the p-type clad layer 18 and composed of p-type GaN having a thickness of 0.1 μm.

These layers 12 to 19 are formed on the substrate 11 in succession by epitaxial growth. The stripe-shaped ridge stripe 20 composed of part of the p-type clad layer 18 and the p-type contact layer 19 is formed by forming each of the layers 12 to 19, inclusive of the p-type contact layer 19 in succession by epitaxial growth and then by removing the p-type clad layer 18 and the p-type contact layer 19 by etching. The laser chip 10 according to the present embodiment has an oscillation wavelength of 405 nm, and the ridge stripe has a width of 1.2 μm to 2.4 μm, for example, about 1.5 μm. In a broad area laser used for illumination or the like, the ridge stripe may have a width of 3 μm to 50 μm. Besides, as shown in FIG. 5A, the ridge stripe 20 may have a mesa shape.

The laser chip 10 has: an insulation film 21 composed of $SiO_2/TiO_2$ and formed to fill both sides of the ridge stripe 20; a p electrode 22 composed of Pd/Mo/Au and formed on the ridge stripe 20 and the insulation film; and an n electrode 23 composed of Hf/Al and formed on the surface opposite to the surface on which the buffer layer 12 of the substrate 11 is formed.

As explained later, a protection film and a light absorption film formed on the protection film are formed on the surfaces (surfaces A and B) substantially perpendicular to the direction in which the ridge stripe 20 extends. In the present embodiment, as shown in FIG. 1, the low-reflectance film 3 and the light absorption film 5 are formed on the surface A used as the light emitting end surface, and the high-reflectance film 4 is formed on the surface B.

These nitride semiconductor layers 12 to 19 provided in the laser chip 10 can be laminated with processes such as MOCVD (metal organic chemical vapor deposition), MBE (molecular beam epitaxy), HVPE (hydride vapor phase epitaxy), or the like. The insulation film 21 and the protection films 3, 4 can be formed with various sputtering processes such as magnetron sputtering, ECR (electron cyclotron resonance) sputtering, or the like or with PECVD (plasma enhanced chemical vapor deposition). The metal films such the electrodes 21, 22 can be formed with various evaporation methods such as EB (electron beam) evaporation, electric resistance heating evaporation, or the like, or with the foregoing various sputtering processes. The light absorption layer 5 may be formed with one selected from these processes according to a kind of material used for the light absorption film.

The structures of the protection film and the light absorption film are shown in the side view of FIG. 5B. As shown in FIG. 5B, the following films are formed on the surface A as the low-reflectance film 3 in the following order of: an aluminum oxynitride ($AlO_xN_{1-x}$ (where, $0<x<1$)) film 3a, a silicon nitride (SiN) film 3b, and an aluminum oxide ($Al_2O_3$) film 3c, and the $AlO_xN_{1-x}$ film 3a has a thickness of 20 nm, the SiN film 3b has a thickness of 200 nm, and the $Al_2O_3$ film 3c has a thickness of 140 nm. The light absorption film 5 is composed of palladium (Pd) and has a thickness of 3.5 nm.

On the other hand, the high-reflectance film 4 is formed on the surface B in the following order of: an $AlO_xN_{1-x}$ film 4a, a SiN film 4b, and four sets of films, each film being composed of a silicon dioxide ($SiO_2$) film 4c and a titanium oxide ($TiO_2$) film 4d. Further, an $SiO_2$ film 4e is formed on the fourth $TiO_2$ film 4d. The $AlO_xN_{1-x}$ film 4a film has a thickness of 20 nm, the SiN film 4b has a thickness of 80 nm, the $SiO_2$ film 4c of the set has a thickness of 71 nm, and the $TiO_2$ film 4d has a thickness of 46 nm, and the $SiO_2$ film 4e formed on the fourth $TiO_2$ film 4d has a thickness of 142 nm.

Here, as examples of forming the protection films 3, 4 and the light absorption film 5, a case where ECR sputtering is used for the protection film 3, 4, and EB evaporation is used for the light absorption film 5 is explained. To begin with, to form the low-reflectance film 3 on the end surface on the light emitting side, a bar obtained by cleaving a wafer is inserted in the film forming chamber of an ECR sputtering apparatus. Here, a bar has a plurality of laser chips 10 shown in FIG. 5 unitarily connected to each other, and the plurality of laser chips 10 are connected to each other in a line in the direction substantially perpendicular to the direction in which the ridge extends, with the surfaces A aligned with each other and so are the surfaces B. The bar is divided into separate chips to obtain the laser chip 10. The bar may be divided before the protection layer is formed.

After the bar is inserted in the ECR sputtering apparatus, nitrogen gas is introduced at a flow rate of 5.2 ccm, and oxygen gas is introduced at a flow rate of 0.1 ccm as well. And, to generate plasma, argon gas is introduced at a flow rate of 20.0 ccm. Besides, an RF (radio frequency) power of 500 W is applied to the Al target, and a microwave power of 500 W is applied to generate argonplasma, and thus the $AlO_xN_{1-x}$ film 3a is formed, where x can be controlled by suitably changing the flow rates of nitrogen gas and oxygen gas.

Next, the target is changed with Si, and nitrogen gas is introduced at a flow rate of 5 ccm to form the SiN film 3b. And, the target is changed with Al again, and oxygen gas is introduced at a flow rate of 5.8 ccm to form the $Al_2O_3$ film 3c. At this time, argon gas is also introduced at a flow rate of 20.0 ccm, an RF power of 500 W is applied to the Si and Al targets, and a microwave power of 500 W is applied to generate argonplasma.

Then, the bar on which the low-reflectance film 3 is formed is taken out from the ECR sputtering apparatus, and the light absorption film 5 composed of Pd is formed in an EB evaporation apparatus at a temperature of about 150° C. Instead of the EB evaporation apparatus, the ECR sputtering apparatus may be used to form the light absorption film 5 on the low-reflectance film 3 in succession.

Likewise, the high-reflectance 4 is formed. Specifically, using the ECR sputtering apparatus, the $AlO_xN_{1-x}$ film 4a, the SiN film 4b, the four sets of the $SiO_2$ film 4c and the $TiO_2$ film 4d, and the $SiO_2$ film 4e are formed in succession. Then, the bar on which the protection films 3, 4, and the light absorption film 5 are formed is divided to obtain the laser chip shown in FIG. 5.

Figure 6:
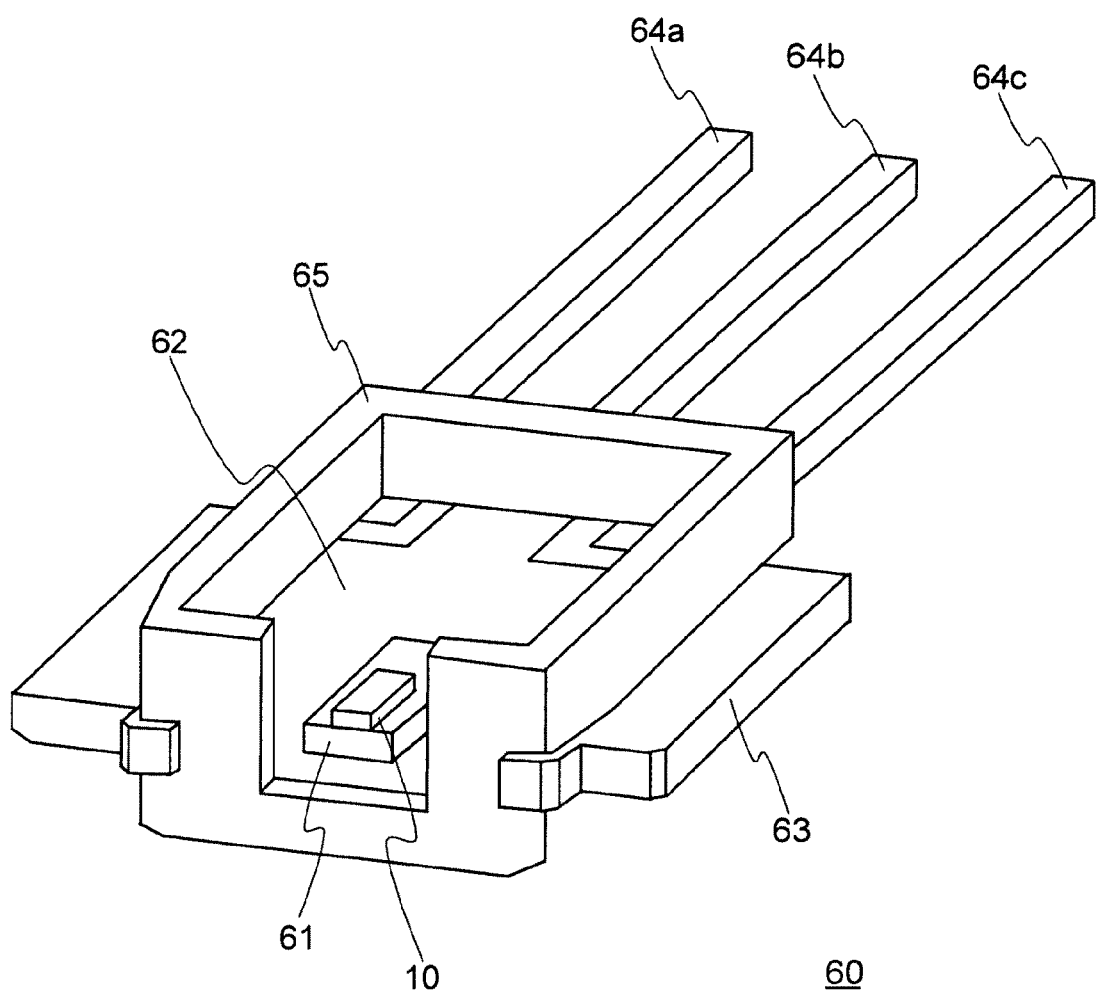
FIG. 6 is a schematic perspective view of a laser device according to the first embodiment of the present invention.

Next, an example of a laser device in which the laser chip 10 thus obtained is mounted is explained. In the present embodiment, a case where the chip is mounted in a frame package that is not sealed air-tightly is explained using FIG. 6. FIG. 6 is a schematic perspective view of a laser device in the present embodiment.

As shown in FIG. 6, a laser device 60 in the present embodiment has: the laser chip 10; a sub-mount 61 on which the laser chip 10 is fixed; a frame 62 on which the sub-mount 61 is fixed; a pair of heat radiation fins 63 unitarily provided with both ends of the frame 62; a lead pin 64 through which electric power is supplied to the laser chip 10; and a resin mold 65 unitarily holding lead pins 64a to 64c.

The sub-mount 61, the frame 62, and the heat radiation fins 63 are made of a metal material such as copper, iron or the like, and heat generated by the laser chip 10 is conducted to the frame 62 and the heat radiation fins 63 via the sub-mount 61 to be radiated. In the present embodiment, three lead pins 64a to 64c are arranged: the center lead pin 64b is connected to the frame 62, and the two lead pins 64a and 64c at both ends are fixed by the resin mold 65 to be unitarily formed with the frame 62.

And a result of a driving test in which electric power is supplied to the laser chip 60 thus structured in a continuous oscillation is shown by the graph in FIG. 2 which is used to explain the basic structure of the present invention. Even if the laser chip 60 is not sealed air-tightly, it is possible to prevent the collection and accumulation of pollutants, a short device life and an unstable device operation which are caused by the increase in the driving current due to the lapse of the driving time.

In the present embodiment, because a structure to seal the laser chip 10 air-tightly is not necessary, the laser device 60 can be made compact. Accordingly, the laser device 60 can be easily applied to light sources for information recording apparatuses, typically, optical pickups of CDs and DVDs.

Second Embodiment

Figure 7:
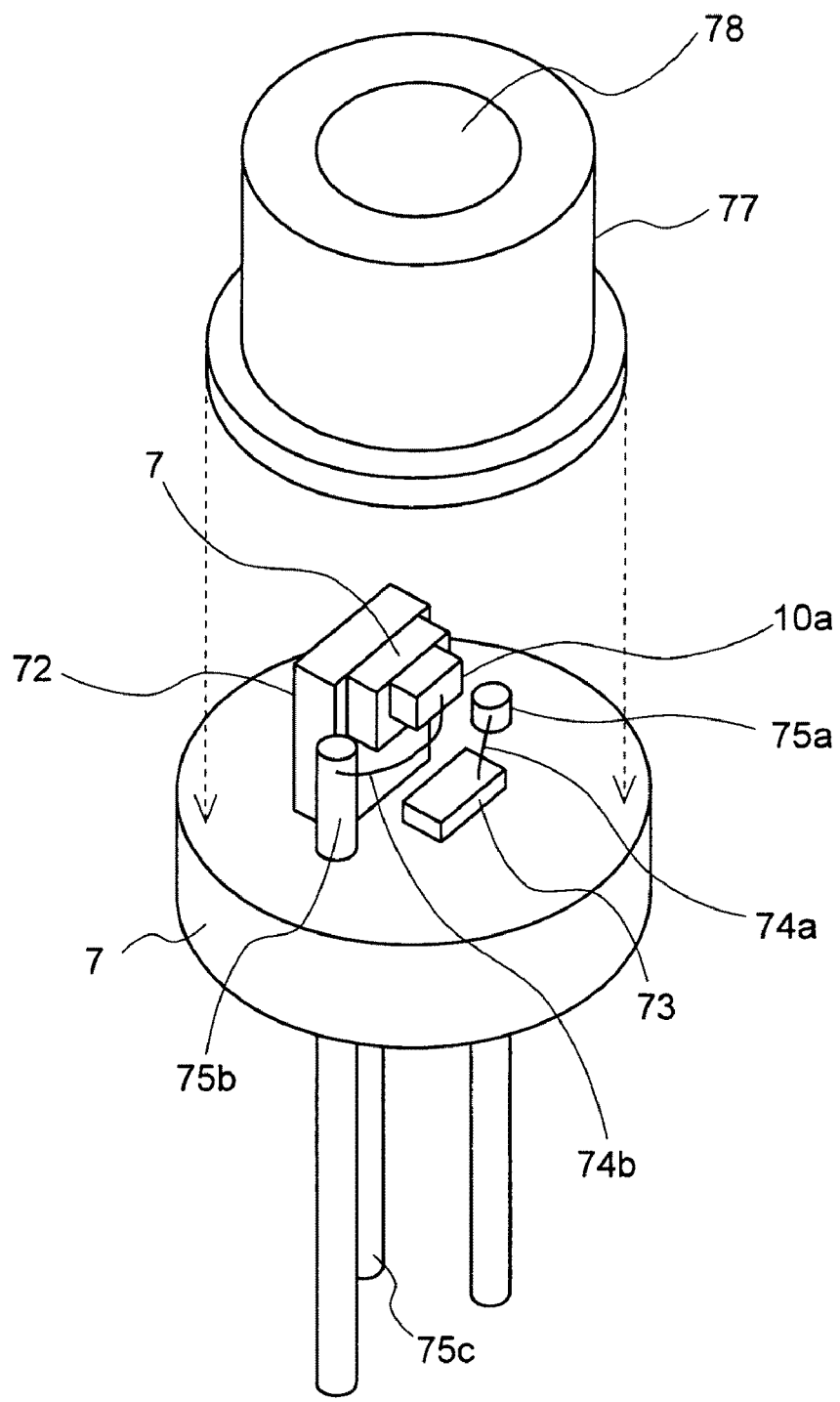
FIG. 7 is a schematic perspective view of a laser device according to a second embodiment of the present invention.

Next, a second embodiment is explained using FIG. 7. In the present embodiment, a laser chip is mounted in a can package that needs air-tight sealing, and FIG. 7 is a perspective view of a laser device according to the present embodiment. A laser chip 10a used in the present embodiment has a structure almost identical to the structure shown in FIG. 5 in the first embodiment, with an exception that the high-reflectance film 4 has a reflectance of 70% to 80%, that is, design modifications are made to make the number of films constituting the high-reflectance film 4 smaller than the laser chip 10 shown in FIG. 5, and to change the thicknesses of one or more films of the high-reflectance film 4.

In the present embodiment, the light absorption film is formed not only on the low-reflectance film but also on the high-reflectance film. This film is composed of Pd likewise as in the first embodiment, and has a thickness of 4 nm.

As shown in FIG. 7, a laser device 70 according to the present embodiment has: a laser chip 10a; a sub-mount 71 on which the laser chip 10a is fixed; a block portion 72 on which the sub-mount 71 is fixed; a photo diode 73 which receives light emitted via the high-reflectance film side of the laser chip 10a to generate a control signal; a pin 75a electrically connected to the photo diode 73 via a wire 74a; a pin 75b electrically connected to the laser chip 10a via a wire 74b; a stem 76 on one surface of which the block portion 72 and the photo diode 73 are mounted, and through the one surface and the other opposite surface of which the pins 74a and 75a are arranged; a pin 75c connected to the other surface of the stem 76 to serve as the common electrode for the photo diode 73 and the laser chip 10a; a cap 77 connected to the one surface of the stem 76 for the air-tight sealing; and a glass window 78 provided in the cap 77 and through which the light emitted via the low-reflectance film of the laser chip 10a passes. The block portion 72 and the stem 76 are formed unitarily with each other, and made of a metal material such as copper, iron or the like. Besides, the cap 77 and the pins 75a to 75c are also made of a metal material.

In this structure, the connection of the laser chip 10a and the sub-mount 71 is performed with solder, the connection of the sub-mount 71 and the block portion 72 and the connection of the photo diode 73 and the stem 76 are performed with Ag paste, and they are electrically connected. Because the Ag paste contains an organic adhesive, organic matters suspend in the sealed ambience despite the air-tight sealing performed by connecting the cap 77 to the stem 76. And in the structure of the conventional laser device, to alleviate the problem that the organic matters become pollutants and collect and accumulate on the end surface on the light emitting side of the laser chip, the dew point of the dried air to be sealed was strictly controlled (e.g, −35° C. or lower).

However, as in the structure of the present embodiment in which the light absorption film is formed on the surface of the protection film of the laser chip 10a, the organic matters are prevented from becoming pollutants and collecting and accumulating as described above even if they are suspending in the sealed ambience. Therefore, the air-tight sealing is possible without strictly controlling the sealed ambience and suppressing the vapor pressure of the organic matters. Accordingly, the production processes can be simplified. In addition, even if not only the Ag paste but also the other organic adhesives such as epoxy-based, silicon-based adhesives or the like are used, the collection and accumulation of pollutants are prevented, and the degree of freedom in designing the inside of the package can be ensured.

In the present embodiment, the photo diode 73 receives the light emitted through the high-reflectance film side of the laser chip 10a to generate a control signal, and feeds it back to a driving apparatus (not shown) of the laser device 70. Therefore, pollutants can also collect and accumulate on the high-reflectance side, but in the present embodiment, because the light absorption film is also formed on the surface of the high-reflectance film, pollutants are prevented from collecting and accumulating.

Accordingly, the light received by the photo diode 73 is not influenced by the pollutants, and an erroneous control signal is prevented from being fed back to the driving apparatus. In particular, it is possible to prevent the misunderstanding that weak light emitted through the high-reflectance film is due to weak output of the laser device 70 even if it is because of the collection and accumulation of pollutants, and thus prevent an excessively large current from being supplied to the laser device 70.

In the structure of the laser device 70 shown in FIG. 7, the laser chip 10a and the sub-mount 71, the sub-mount 71 and the block portion 72 are directly and electrically connected to each other. However, the laser chip 10a and the block portion 72 may be electrically connected to each other via a wire.

Besides, for the connections of the sub-mount 71 and the stem 76, and the photo diode 73 and the stem 76, solder may be used instead of the Ag paste. In such a structure, conventionally, because there was not a concern that the organic adhesive contained in the Ag paste volatilized, it was possible to obtain the effects that it was unnecessary to control over the vapor pressure of the organic adhesive in the sealed ambience and the dew point of the dried air sealed air-tightly was able to be loosely controlled (e.g., −15° C. or lower).

In contrast, in the structure of the present invention, because the control itself over the dew point can be made fundamentally unnecessary, even if it is compared with the case where solder is used instead of the Ag paste as in this embodiment, the production processes can be dramatically simplified. Besides, whether the Ag paste is used or not, if the air-tight sealing (e.g., welding) of the cap 77 and the stem 76 is not enough, a stable operation cannot be obtained, therefore, a confirmation step is required to confirm if the air-tight sealing is enough or not even in this embodiment, and the yield is low. However, according to the structure of the present invention, even if the air-tight sealing is not enough, it is possible to prevent the collection and accumulation of pollutants, eliminate the confirmation step and increase the yield.

Third Embodiment

Figure 8:
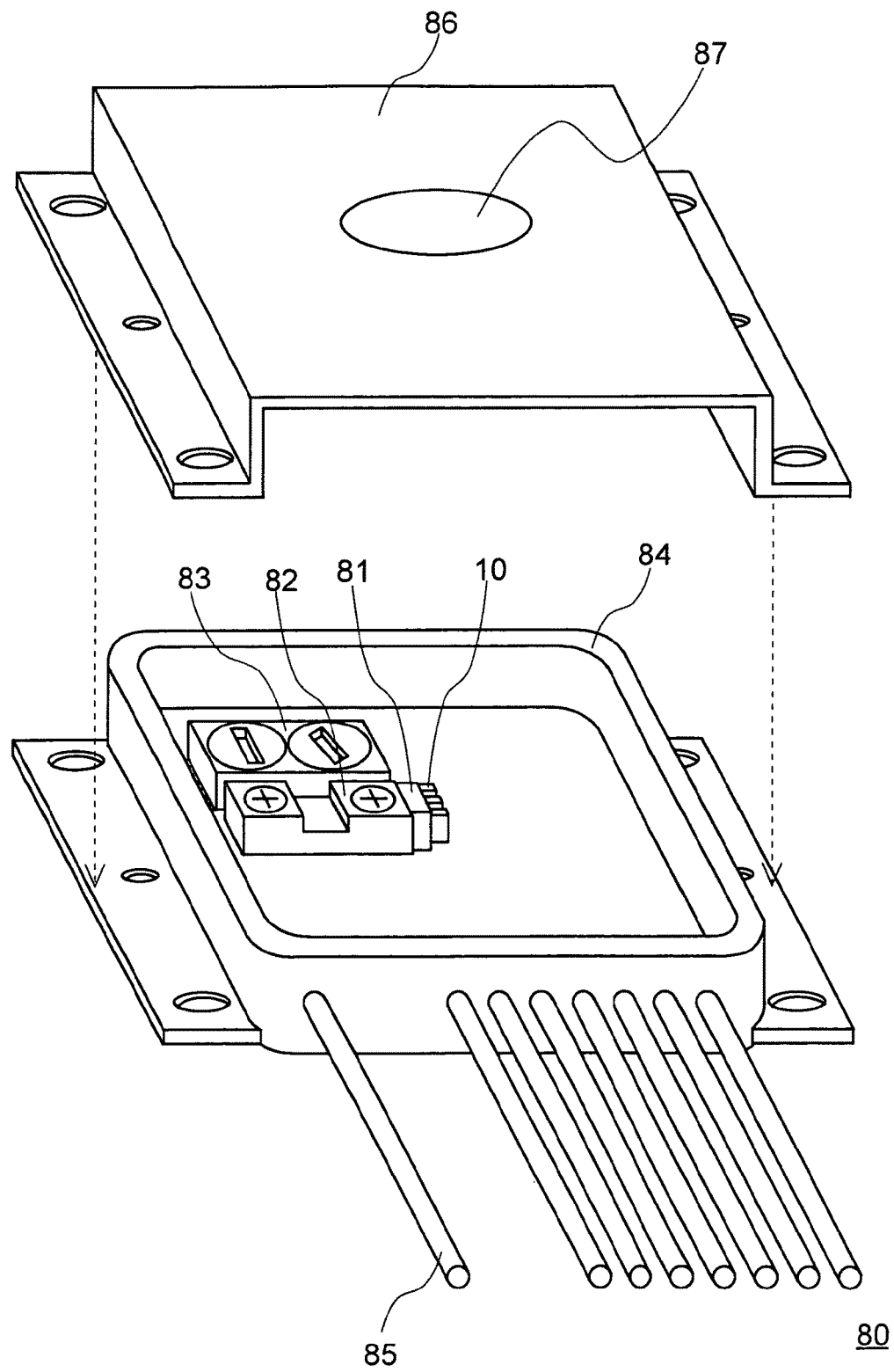
FIG. 8 is a schematic perspective view of a laser device according to a third embodiment of the present invention.

Next, a third embodiment is explained using FIG. 8. In the present embodiment, the laser chip 10 identical to the laser chip 10 in the first embodiment is mounted in an HHL (high heat load) package that needs the air-tight sealing. FIG. 8 is a schematic perspective view of a laser device in the present embodiment. This HHL package is a package that allows a high output in the Watt order used for illumination or the like.

As shown in FIG. 8, a laser device 80 in the present embodiment has: a plurality of laser chips 10; a sub-mount 81 on which the laser chips 10 are fixed; a heat spreader 82 on which the sub-mount 81 is fixed and which radiates heat; a wiring board 83 provided with wires via which electric power is supplied to the parts such as the laser chip 10 and the like arranged in the package; a main body portion 84 in which the heat spreader 81, the wiring board and the others are fixed; lead pins 85 penetrating the main body portion 84 to be electrically connected to the device arranged in the main body portion 84; a cap 86 connected to the main body portion 84 to seal air-tightly; a glass window 87 provided in the cap 86 and through which the light emitted via low-reflectance films of the laser chips 10 passes.

In the laser device 80, other wires, a thermistor for monitoring the temperature inside the main body portion, a Peltier device for lowering the temperature, and a photo diode for monitoring the amount of the light emitted are sometimes arranged, but these members are not shown in FIG. 8 for easy explanation. The plurality of lead pins 85 correspond to their respective devices and the laser chips 10, and electric power is supplied to each device via each lead pin corresponding to the device to operate the device. Besides, the control signals obtained depending on the temperature inside and the optical output are also output via these lead pins and fed back to a driving apparatus (not shown) of the laser device 80.

In such structure of the laser device 80, because the plurality of devices need to be fixed to the main body, there are many places to be adhered and accordingly a large amount of adhesives are needed. In addition, because the internal wires are covered with vinyl, that is, an organic matter, there are many sources of pollutants.

The cap 86 and the main body portion 84 are mad of a metal such as copper, iron or the like, and the connection of the cap 86 and the main body portion 84 is performed with welding or low-temperature soldering. However, the HHL package is difficult to connect compared with the can package described in the second embodiment, and defective sealing often occurs and degrades the yield. When the connection is carried out with low-temperature solder, because the flux, which is contained in the low-temperature solder and removes the metal oxide film on the connected surface to clean it, contains rosin, that is, an organic matter, which also generates pollutants.

However, as in the present embodiment, even in the structure in which the light absorption film is formed on the surface of the protection film of the laser chip 10, even if the organic matters suspend inside or the connection is defective, pollutants are prevented from collecting and accumulating, and it is possible to operate the device with no trouble. Specifically, it is possible to prevent a lowered yield caused by defective sealing due to insufficient connection of the cap 86 and the main body portion 84, and also possible to prevent the increase in the driving current and an unstable device operation due to the collection and accumulation of pollutants on the laser chip.

As in the second embodiment, when a photo diode is disposed in the package to receive the light through the high-reflectance film side of the laser chip, the laser chip may be structured as in the second embodiment. Specifically, the reflectance of the high-reflectance film may be made 70% to 80%, and the light absorption film may be formed on the surface of the high-reflectance film.

Like the HHL package described above, a hologram laser device used in light sources for information recording apparatuses such as optical pickups or the like also has a structure in which a plurality of devices (optical devices such as a photo diode for detecting signals, a hologram device or the like) are contained besides the laser chip. However, also in such a structure, the laser chip in which the light absorption film is formed on the protection film can be used. And, it is possible to prevent a lowered yield caused by imperfect air-tight sealing, and also possible to prevent the increase in the driving current and an unstable device operation due to the collection and accumulation of pollutants on the laser chip.

Fourth Embodiment

In the first to third embodiments, the structure examples of the chips and the packages are chiefly explained. However, in the following fourth to thirteenth embodiments, structure examples of the low-reflectance films and the light absorption films formed on the end surface on the light emitting side of a laser chip are explained. Hereinafter, only structures of the low-reflectance films and the light absorption films are explained. The chips, the high-reflectance films and the packages may have any structures. Besides, the combinations of the films are only examples, and other combinations can also bring the effects of the present invention.

In the fourth embodiment, the low-reflectance film formed on the end surface on the light emitting side is made by forming the following films in the following order of: an aluminum nitride (AlN) film on the end surface/a silicon nitride (SiN) film/an aluminum oxide ($Al_2O_3$) film. A gold (Au) film is formed as the light absorption film on the topmost $Al_2O_3$ film constituting the low-reflectance film. The thickness of the AlN film is 20 nm, the thickness of the SiN film is 300 nm, the thickness of the $Al_2O_3$ film is 80 nm, and the thickness of the Au film is 4.5 nm.

The AlN film formed on the end surface on the light emitting side is tightly adhered to the nitride semiconductor constituting the chip and the other films constituting the low-reflectance film. Therefore, by forming the AlN film, it is possible to prevent the low-reflectance film from peeling off the end surface and increase the yield. Further, by the tight adhesion of the end surface on the light emitting side and the AlN film, it is possible to prevent reaction such as oxidation or the like from occurring on the end surface, and thus to curb change of properties of the end surface caused by the reaction. Because the occurrence of non-radiative recombination on the end surface is suppressed by preventing the change of properties of the end surface, the occurrence of COD (catastrophic optical damage) caused by melted end surface due to heat generated by rapid increase in the non-radiative recombination is prevented, and thus it becomes possible for the device to operate stably. The $AlO_xN_{1-x}$ also has the same characteristics as the AlN film, and it is possible to obtain the same effect by use of a film composed of this material.

Furthermore, because the SiN film has a small coefficient of thermal expansion, the structure of the protection film can be maintained even if the light absorption film which generates heat is formed. Besides the SiN film is excellent in resistance to moisture, it can prevent the properties of the end surface from being changed by water content in the end surface. Accordingly, it is possible to obtain a stable operation (in particular, the prevention of increase in the driving current due to the lapse of the driving time at a constant optical output). The silicon oxynitride ($SiO_xN_{1-x}$ (where, $0<x<1$)) also has the same characteristics as the SiN, and it is possible to obtain the same effect by use of a film composed of this material. And, it is preferable to employ a structure in which SiN or $SiO_xN_{1-x}$ is used together with $AlO_xN_{1-x}$ or AlN on the end surface on the light emitting surface side, specifically, $SiO_xN_{1-x}$ or SiN is interposed between the light absorption film and $AlO_xN_{1-x}$ or between the light absorption film and AlN, because it is possible to obtain a more stable device operation.

Here, may be employed a double-layer structure in which $SiO_xN_{1-x}$ or SiN is formed directly on the end surface of the semiconductor and further the light absorption film is formed on $SiO_xN_{1-x}$ or SiN. Moreover, may be formed between the semiconductor and $SiO_xN_{1-x}$ or between the semiconductor and SiN are other films such as an oxide film (e.g., an aluminum oxide, a silicon oxide, a titanium oxide, or the like) and a nitride film (e.g., an aluminum nitride, silicon nitride, titanium nitride, or the like). In addition, other films such as an oxide film, a nitride film or the like may be formed between $SiO_xN_{1-x}$ and the light absorption film or between SiN and the light absorption film. As described above, $SiO_xN_{1-x}$ or SiN is preferably sandwiched between the end surface of the semiconductor and the outermost light absorption film, because the moisture resistance to water content that is a problem in a non-airtight package, and the collection of Si-system matters which is one of the pollutants are improved at a time.

By forming an Au film as the light absorption film on the surface of the low-reflectance film, it is possible to prevent pollutants from collecting and accumulating on the low-reflectance film and the light absorption film. Therefore, the effects of preventing increase in the driving current and an unstable device operation due to the lapse of the driving time can be obtained. As described above, by forming the protection film and the light absorption film, the laser device has a long life and can operate stably even if it is driven in an atmospheric ambience.

The same effects as those described above can also be obtained even when the thickness of the Au film is changed to 1 nm, 2 nm, and 7 nm.

Fifth Embodiment

In the fifth embodiment, the material of the low-reflectance film formed on the end surface on the light emitting side is identical to that in the fourth embodiment. Specifically, formed on the end surface on the light emitting side are the following films in the following order of: an AlN film on the end surface/a SiN film/an $Al_2O_3$ film. A platinum (Pt) film is formed as the light absorption film on the topmost $Al_2O_3$ film constituting the low-reflectance film. The AlN film has a thickness of 6 nm, the SiN film has a thickness of 100 nm, the $Al_2O_3$ film has a thickness of 200 nm, and the Pt film has a thickness of 4 nm.

With the above-described structure of the low-reflectance film and the light absorption film composed of Pt, as in the first to fourth embodiments, it is possible to obtain the effects by tightly adhering the low-reflectance film to the end surface and by preventing pollutants form collecting and accumulating on the low-reflectance film and the light absorption film. Besides, as in the present embodiment, even when the AlN film and the SiN film are made thinner than in the fourth embodiment, the same effects can be obtained.

The same effects as those described above can also be obtained even when the thickness of the Pt film, that is, the light absorption film, is changed to 1 nm, 2 nm, and 8 nm.

Sixth Embodiment

In the sixth embodiment, the material of the low-reflectance film formed on the end surface on the light emitting side is identical to that in the fourth and fifth embodiments. Specifically, formed on the end surface on the light emitting side are the following films in the following order of: an AlN film on the end surface/a SiN film/an $Al_2O_3$ film. In the present embodiment, a titanium (Ti) film is formed on the topmost $Al_2O_3$ film constituting the low-reflectance film, and a gold (Au) film is further formed on the Ti film, which presents a multi-film of the Ti film and the Au film as the light absorption film. The AlN film has a thickness of 20 nm, the SiN film has a thickness of 300 nm, the $Al_2O_3$ film has a thickness of 80 nm, the Ti film has a thickness of 1.5 nm, and the Au film has a thickness of 2.5 nm.

With the above-described structure of the low-reflectance film and the light absorption film comprising the multi-film, as in the first to fifth embodiments, it is possible to obtain the effects by tightly adhering the low-reflectance film to the end surface and by preventing pollutants form collecting and accumulating on the low-reflectance film and the light absorption film.

In the present embodiment, the light absorption film is constituted by the multi-film of the Ti film and the Au film. However, the Au film may be replaced with the Pt film having the same thickness as the Au film. In this case, the same effects can also be obtained.

Seventh Embodiment

In the seventh embodiment, the material of the low-reflectance film formed on the end surface on the light emitting side is identical to that in the fourth to sixth embodiments. Specifically, formed on the end surface on the light emitting side are the following films in the following order of: an AlN film on the end surface/a SiN film/an $Al_2O_3$ film. In the present embodiment, a molybdenum (Mo) film is formed as the light absorption film on the topmost $Al_2O_3$ film constituting the low-reflectance film. The AlN film has a thickness of 20 nm, the SiN film has a thickness of 300 nm, the $Al_2O_3$ film has a thickness of 80 nm, the Mo film has a thickness of 4.0 nm.

With the above-described structure of the low-reflectance film and the light absorption film comprising the Mo film, as in the first to sixth embodiments, it is possible to obtain the effects by tightly adhering the low-reflectance film to the end surface and by preventing pollutants form collecting and accumulating on the low-reflectance film and the light absorption film.

The same effects as those described above can also be obtained even when the thickness of the Mo film, that is, the light absorption film, is changed to 1 nm, 2 nm, and 12 nm.

Eighth Embodiment

In the eighth embodiment, the material of the low-reflectance film formed on the end surface on the light emitting side is identical to that in the fourth to seventh embodiments. Specifically, formed on the end surface on the light emitting side are the following films in the following order of: an AlN film on the end surface/a SiN film/an $Al_2O_3$ film. In the present embodiment, a molybdenum (Mo) film is formed on the topmost $Al_2O_3$ film constituting the low-reflectance film, and a gold (Au) film is further formed on the Mo film, which presents a multi-film of the Mo film and the Au film as the light absorption film. The AlN film has a thickness of 20 nm, the SiN film has a thickness of 300 nm, the $Al_2O_3$ film has a thickness of 80 nm, the Mo film has a thickness of 1.5 nm, and the Pt film has a thickness of 2.5 nm.

With the above-described structure of the low-reflectance film and the light absorption film comprising the multi-film, as in the first to seventh embodiments, it is possible to obtain the effects by tightly adhering the low-reflectance film to the end surface and by preventing pollutants form collecting and accumulating on the low-reflectance film and the light absorption film.

In the present embodiment, the light absorption film is constituted by the multi-film of the Mo film and the Au film. However, the Au film may be replaced with the Pt film having the same thickness as the Au film. In this case, the same effects can also be obtained.

Ninth Embodiment

In the ninth embodiment, the material of the low-reflectance film formed on the end surface on the light emitting side is identical to that in the fourth to eighth embodiments. Specifically, formed on the end surface on the light emitting side are the following films in the following order of: an AlN film on the end surface/a SiN film/an $Al_2O_3$ film. In the present embodiment, an aluminum (Al) film is formed as the light absorption film on the topmost $Al_2O_3$ film constituting the low-reflectance film. The AlN film has a thickness of 20 nm, the SiN film has a thickness of 300 nm, the $Al_2O_3$ film has a thickness of 80 nm, the Al film has a thickness of 4.0 nm.

With the above-described structure of the low-reflectance film and the light absorption film composed of Al, as in the first to eighth embodiments, it is possible to obtain the effects by tightly adhering the low-reflectance film to the end surface and by preventing pollutants form collecting and accumulating on the low-reflectance film and the light absorption film.

Tenth Embodiment

In the eighth embodiment, the material of the low-reflectance film formed on the end surface on the light emitting side is identical to that in the fourth to ninth embodiments. Specifically, formed on the end surface on the light emitting side are the following films in the following order of: an AlN film on the end surface/a SiN film/an $Al_2O_3$ film. In the present embodiment, an oxygen-depleted aluminum film represented by $AlO_x$ ($0<x<1.5$), that is, an oxygen-depleted film of an aluminum oxide is used as the light absorption film on the $Al_2O_3$ film that is the topmost film constituting the low-reflectance film, where the $AlO_x$ is a compound whose composition deviates in the direction of the stoichiometric composition of Al:O=2:3 to the composition in which the oxygen amount becomes less. The AlN film has a thickness of 20 nm, the SiN film has a thickness of 300 nm, the $Al_2O_3$ film has a thickness of 80 nm, the $AlO_x$ film has a thickness of 60 nm.

As described above, $Al_2O_3$ is substantially transparent to laser light. However, because an oxygen-depleted film such as $AlO_x$ or the like absorbs light well, such a film can be used as the light absorption film.

In the fabrication process of the $AlO_x$ film, for example, when the ECR sputtering apparatus is used, the $AlO_x$ film can be easily obtained by lowering the flow rate (e.g., 5.8 ccm) of oxygen to form the $Al_2O_3$ film to, for example, 4.3 ccm. The other conditions such as the flow rate of argon gas, electric power to be supplied and the like may be the same as those described in the first embodiment, that is, the flow rate of argon gas may be 20 ccm, the RF power applied to the Al target may be 500 W, and the microwave power to generate plasma may be 500 W.

With the above-described structure of the low-reflectance film and the light absorption film composed of $AlO_x$, as in the first to ninth embodiments, it is possible to obtain the effects by tightly adhering the low-reflectance film to the end surface and by preventing pollutants form collecting and accumulating on the low-reflectance film and the light absorption film.

Moreover, because the light amount absorbed by the $AlO_x$ film can be controlled by the value of x in the composition and the film thickness, it can be more strictly adjusted than the light absorption film whose light absorption amount is controlled by only the metal film and the like. For example, in a case where the light absorption is desired to be curbed to a limit, when a metal film is used, a film forming method and film forming conditions must be selected to form a thin and uniform film. However, when using the $AlO_x$ film, even if it is a thick film, it is possible to change the value of x to a value near 1.5, and it is easy to adjust the light absorption.

When a sputtering apparatus is used, because both the low-reflectance film and the light absorption film can be formed only by setting the Al and Si targets, and by suitably changing the flow rate of each gas of argon, oxygen, and nitrogen, it is possible to form the films in a continuous process.

Instead of using $AlO_x$ as the light absorption film, an oxygen-depleted silicon oxide film (e.g., the thickness is 8 nm) represented by $SiO_x$ ($0<x<2$) may be used, where $SiO_x$ is a compound whose composition deviates in the direction of the stoichiometric composition of Si:O=1:2 to the composition in which the oxygen amount becomes less. As described above, even when the $SiO_x$ film is used, the same effects as those in the case where $AlO_x$ is used can be obtained.

Instead of using an oxygen-depleted film, a nitrogen-depleted aluminum nitride film represented by $AlN_x$ ($0<x<1$) or a nitrogen-depleted silicon nitride film represented by $SiN_x$ ($0<x<1.33$ . . . ) may be used, where $AlN_x$ is a compound whose composition deviates in the direction of the stoichiometric composition of Al:N=1:1 to the composition in which the nitrogen amount becomes less, and $SiN_x$ is a compound whose composition deviates in the direction of the stoichiometric composition of Si:N=3:4 to the composition in which the nitrogen amount becomes less AlN absorbs only a little amount of the light emitted. However, by using a nitrogen-depleted film, it is possible to increase the light absorption amount as in the tenth embodiment where the oxygen-depleted film is used, and possible to use as the light absorption film. In a case where a sputtering apparatus is used, the nitrogen-depleted film can be easily formed as the oxygen-depleted film by making the flow rate of the nitrogen gas lower than the flow rate in forming the AlN film. SiN is in a state where the nitrogen is depleted, but the light absorption amount is small. Accordingly, when $SiN_x$ is used as the light absorption film, the value of x is preferably made smaller.

Moreover, like the oxygen-depleted film, because the light amount absorbed by the nitride-depleted film of $AlN_x$ or $SiN_x$ can be controlled by the value of x in the composition and the film thickness, it can be more strictly adjusted than the light absorption film whose light absorption amount is controlled by only the thickness of a metal film or the like. Even in forming both light absorption films, when a sputtering apparatus is used, because both the low-reflectance film and the light absorption film can be formed only by setting the Al and Si targets, and by suitably changing the flow rate of each gas of argon, oxygen, and nitrogen, it is possible to form the films in a continuous process.

Eleventh Embodiment

In the eleventh embodiment, the material of the low-reflectance film formed on the end surface on the light emitting side is identical to that in the fourth to tenth embodiments. Specifically, formed on the end surface on the light emitting side are the following films in the following order of: an AlN film on the end surface/a SiN film/an $Al_2O_3$ film. In the present embodiment, a titanium nitride (TiN) film is formed as the light absorption film on the $Al_2O_3$ film that is the topmost film constituting the low-reflectance film. The AlN film has a thickness of 20 nm, the SiN film has a thickness of 300 nm, the $Al_2O_3$ film has a thickness of 80 nm, and the TiN film has a thickness of 20 nm.

The sputtering process can also be used to form the TiN film. In the ECR sputtering apparatus described above, the TiN film can be easily formed by introducing nitrogen and argon gases and sputtering by use of the Ti target.

With the above-described structure of the low-reflectance film and the light absorption film composed of TiN, as in the first to tenth embodiments, it is possible to obtain the effects by tightly adhering the low-reflectance film to the end surface and by preventing pollutants form collecting and accumulating on the low-reflectance film and the light absorption film.

It is not limited to the TiN film, the above-described $AlN_x$ film and $SiN_x$ film, that is, even nitrides of other metals (e.g., zirconium (Zr), yttrium (Y), niobium (Nb), hafnium (Hf), tantalum (Ta), tungsten (W), or the like) can absorb light emitted, and may be used as the light absorption films. In addition, these films may be used as the nitrogen-depleted films.

Twelfth Embodiment

In the twelfth embodiment, the material of the low-reflectance film formed on the end surface on the light emitting side is identical to that in the fourth to eleventh embodiments. Specifically, formed on the end surface on the light emitting side are the following films in the following order of: an AlN film on the end surface/a SiN film/an $Al_2O_3$ film. In the present embodiment, a palladium oxide film is used as the light absorption film on the $Al_2O_3$ film that is the topmost film constituting the low-reflectance film. The AlN film has a thickness of 20 nm, the SiN film has a thickness of 300 nm, the $Al_2O_3$ film has a thickness of 80 nm, and the palladium oxide film has a thickness of 3 nm.

As a method of forming the palladium oxide film, for example, a method in which after a Pd metal film is formed, it is oxidized with oxygen plasma in a plasma generating apparatus to form the palladium film can be used. It is also possible to form it by using a palladium oxide target, and performing evaporation and sputtering. Besides, it is also possible form the film introducing oxygen, and the oxidation after the film formation may also be performed using oxygen plasma.

The thickness t of the palladium oxide film is desirably in the range of 0 nm<t≦100 nm. If it is more than 100 nm, the percentage of light absorbed increases, and the light extraction efficiency is degraded. A more desirable range is 0 nm<t≦50 nm, and a further more desirable range is 0 nm<t≦10 nm. Only a little adhesion of the light absorption film can bring the effects.

In above-described embodiment, the palladium oxide is used for the light absorption film. However, an oxide of a metal such as rhodium (Rh), iridium (Ir), osmium (Os), ruthenium (Ru) or the like may be used. In addition, a plurality of oxides of such metals may be combined.

Thirteenth Embodiment

Figure 11:
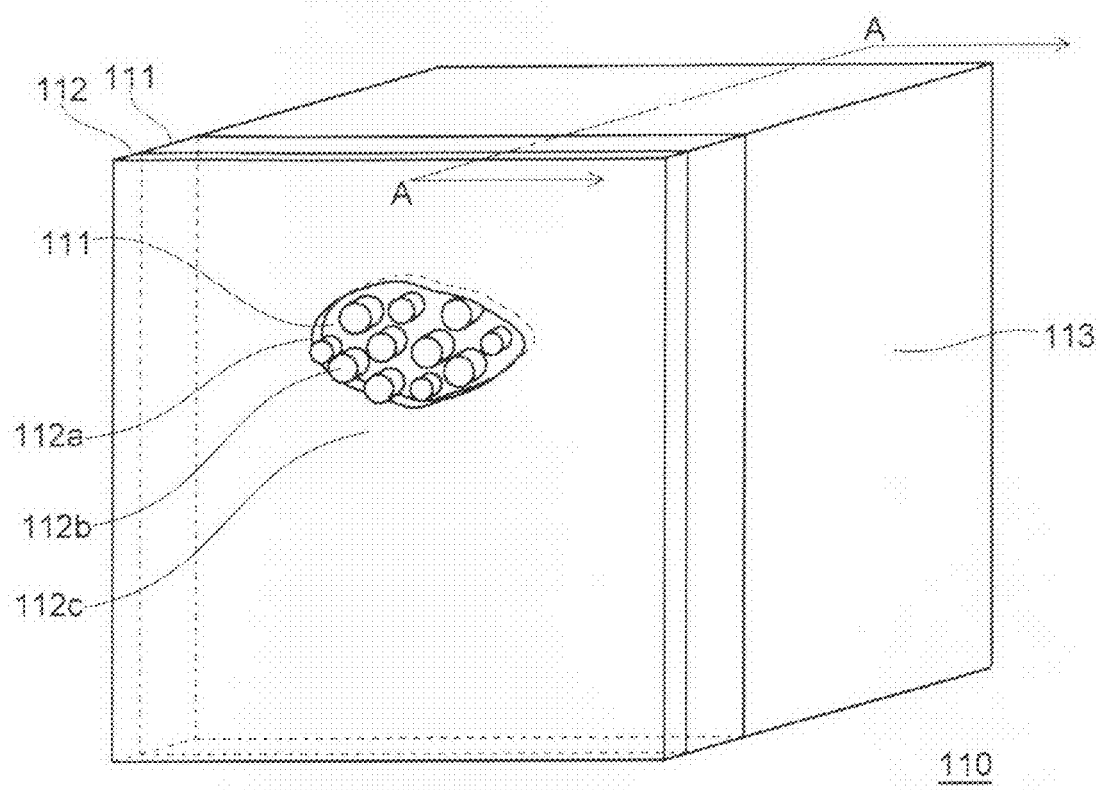
FIG. 11 is a schematic perspective view of a laser chip according to a thirteenth embodiment of the present invention.

In the thirteenth embodiment, the low-reflectance film is made by forming the following films in the following order beginning with the end surface on the light emitting side: an $AlO_xN_{1-x}$ film/a SiN film. A palladium (Pd) film is used as the light absorption film to be formed on the surface of the SiN film which is the topmost film constituting the low-reflectance film. The $AlO_xN_{1-x}$ film has a thickness of 20 nm, the SiN film has a thickness of 160 nm, and the Pd film has a thickness of 5 nm. This laser chip is shown in FIG. 11. FIG. 11 is a schematic perspective view the laser chip according to the thirteenth embodiment, and shows a schematic enlarged view of the side on which the light absorption film is formed.

As shown in FIG. 11, in the laser chip 11 according to the present embodiment, the light absorption film 112 formed on the surface of the low-reflectance film 111 is partly condensed to dots (dotting). As a doting method, there is, for example, a method in which the laser device is driven. When the laser device is driven to oscillate, part of the laser light emitted is absorbed by the palladium constituting the light absorption film 112, and part of the light absorption film generates heat. The light absorption film is dotted by the heat generated, and as shown in FIG. 11, it is possible to obtain the laser chip 110 in which the light absorption film is partly dotted.

The dotting takes place chiefly in the region through which the laser light passes. In such region, because the light absorption film 112 is sufficiently heated by the laser light, the dotting is encouraged, and the light absorption film 112 is dotted to lumps, thus a light absorption film dot 112b is obtained. Besides, in the region where the light absorption film dot 112b is formed, because the palladium constituting the light absorption film 112 condenses at the time when the light absorption film dot 112b is formed, the light absorption film 112 becomes discontinuous (part having a thickness of 0 appears). In the discontinuous region 112a, part of the SiN film, that is, the topmost film of the low-reflectance film 111, is exposed. On the other hand, in the continuous region 112c except the discontinuous 112a, the light absorption film 112 is a continuous film and the low-reflectance film 111 is not exposed.

Figure 12:
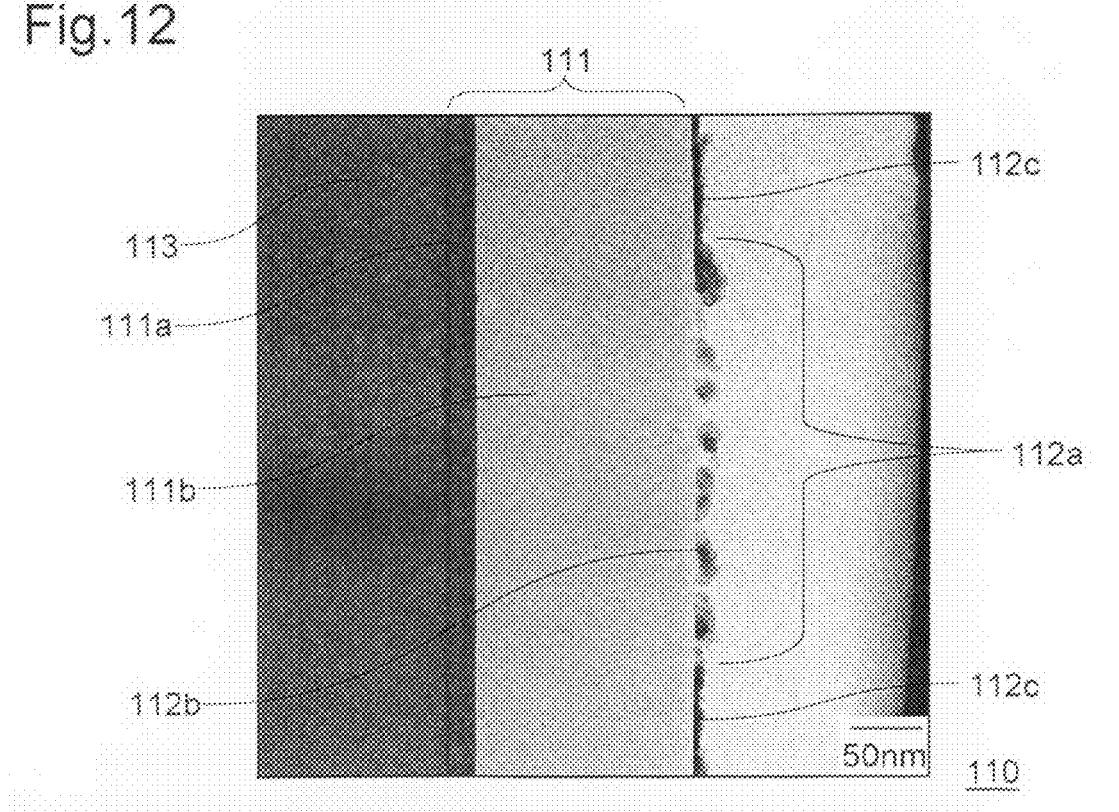
FIG. 12 is a microphotograph showing a section of the laser chip according to the thirteenth embodiment of the present invention.

The dotting of the light absorption film 112 is can be carried out under a continuous oscillation at an optical output of 30 mW, 25° C., and for about two hours. Explained using FIG. 12 is a result of a performance test of the dotted laser chip 110 in which it was driven continuously at 20 mW, 25° C., and for about 1000 hours. FIG. 12 is a microphotograph which was taken under a transmission electron microscope (TEM) and shows a section of the laser chip 110 according to the thirteenth embodiment of the present invention. Specifically, FIG. 12 shows a section taken along the plane A-A of the laser chip 110 shown in FIG. 11.

As shown in FIG. 12, an $AlO_xN_{1-x}$ film 111a having a thickness of 20 nm is formed on an end surface on the light emitting side of a nitride semiconductor 113, and an SiN film 111b having a thickness of 160 nm is further formed on the upper surface of the film 111a. Further, a light absorption film 112 which is composed of palladium and has a thickness of 5 nm is formed on the upper surface of the SiN film 111b. The light absorption film 112 comprises the discontinuous region 112a having the light absorption film dot 112b in its region, and the continuous region 112c. The size of the light absorption film dot 112b depends on the thickness of the light absorption film 112 formed and falls in the range of about 0.5 nm to about 50 nm.

Even when the laser chip 110 whose light absorption film 112 is partly dotted as shown in FIG. 12 is driven, pollutants are prevented from collecting and accumulating on the end surface of the laser chip 110. In other words, even if the light absorption film 112 is not a continuous layer but has lumps to be discontinuous, it is possible to prevent pollutants from collecting and accumulating on the end surface.

In addition, as in the present embodiment, when the light absorption film dots 112b are formed, part of the metal (palladium in the present embodiment) constituting the light absorption film 112 disappears (the thickness is 0) from the surrounding region of the light absorption film dot 112b. Accordingly, the slope efficiency in the time of the laser driving can be upgraded and the driving current can be reduced.

Besides, as in the present embodiment, when the dotting is performed with the laser light emitted, the part through which the light passes can be dotted surely and easily.

In the present embodiment, as a dotting method, a method in which the condensing is conducted with the laser light emitted. However, a method in which the entire laser chip 110 is heated to perform the dotting may be employed. In such a case, unlike the structures shown in FIGS. 11 and 12, the discontinuous region 112a extends throughout the light absorption film 112. However, even in such a case, as in each embodiment described above, it is possible to obtain the effect of pollutants being prevented form collecting and accumulating.

The dotting may be conducted by applying energy such as light, heat or the like to the light absorption film 112 from outside. In such a case, the discontinuous region 111a can be formed at any positions. The dotting may be performed at the time of forming the light absorption film 112. In other words, the film forming may be conducted, while the condensing being made. Besides, to conduct the dotting, may be used any methods in which at least part of the light absorption film 112, especially at least part of the region through which the emitted laser light passes is eventually dotted to be discontinuous.

Even if the light absorption film 112 is not provided with the discontinuous region 112a, the effect in the present embodiment can be obtained. For example, may be employed a structure in which the light absorption film 112 has a continuous layer, and lumps like the light absorption film dots 112b are made on the surface of the continuous layer. Even in such a structure, because the light absorption is curbed if the continuous layer is sufficiently thin, the effect of the driving current being lowered can be obtained as in the case where the above-described discontinuous region 112a is formed. In addition, even when the discontinuous layer is made sufficiently thin, because lumps composed of the material of the light absorption film 112 are formed, the lumps can prevent the collection and accumulation of pollutants.

The thickness of the light absorption film 112, the kinds of the materials used, the kinds of the base layers and the like can be suitably selected to control the dot sizes and the like. In the present embodiment, palladium is used as a dotted metal. However, gold (Au), platinum (Pt), rhodium (Rh), iridium (Ir), osmium (Os), ruthenium (Ru) or the like may be used.

Modifications

In the first to thirteenth embodiments described above, although the low-reflectance film is constituted by a few kinds of films, it may be formed with one kind of film. Besides, as the protection film, may be used a film which is composed of an oxide containing at least one element selected from among Al, Si, Hf, Ti, Nb, Ta, W and Y, composed of a nitride containing Al, Si or the like, or composed of an oxynitride containing Al, Si or the like.

In the fourth to thirteenth embodiments, only the structure on the low-reflectance film side is described. However, in a case where part of the light is also emitted through the high-reflectance film, a light absorption film may be formed on the high-reflectance film. By using such a structure, it is possible to prevent pollutants from collecting and accumulating on the high-reflectance film side. A film such as an AlN film, an $AlO_xN_{1-x}$ film, or the like which enhances the adhesion may be formed as part of the high-reflectance film directly on the end surface on which the high-reflectance film is formed. Further, the high-reflectance film may be provided with an SiN film, an $SiO_xN_{1-x}$ film or the like.

Moreover, in the structure in which the light absorption film is formed, and the protection film is formed with a film containing SiN, $SiO_xN_{1-x}$ or the like, because it is possible to reduce the increase in the driving current, the protection film is preferably provided with a film composed of such a material. Especially in the case where the $SiO_xN_{1-x}$ film having a thickness of more than 20 nm is used, the effect of curbing the increase in the driving current can be obtained. Therefore, the $SiO_xN_{1-x}$ film preferably has a thickness of more than 20 nm, further more than 80 nm.

Besides, it is desirable the thickness t of the light absorption film is in the range of 0 nm<t≦100 nm. If it is more than 100 nm, the percentage of light absorbed increases, and the light extraction efficiency is degraded. A more desirable range is 0 nm<t≦50 nm, and a further more desirable range is 0 nm<t≦10 nm. Only a little adhesion of the light absorption film can bring the effects.

Further, as a material for the light absorption film, Au, Pt, Rh, Ir, Pd, Os, Ru or the like is preferably used, because the collection coefficient of a compound of the Si system, that is, one of pollutants, is lowered and it is difficult for such a compound to collect. In addition, as in the sixth and eighth embodiments described above, when the light absorption film is formed with two or more films, a film composed of such a metal is preferably used on the outermost film, because the effect of curbing the collection and accumulation of pollutants is obtained.

The light absorption film may be made of two or more kinds of metals, or may be a multi-film that is a combination of several kinds of films like a combination of a metal film and a nitride film, a combination of a nitride film and an oxygen-depleted film or the like.

The present invention relates to a semiconductor light emitting device and a method of fabricating a semiconductor light emitting device, and more particularly, to a nitride semiconductor laser device which emits light having a short wavelength, typically, a semiconductor light emitting device which has a light emitting portion on which pollutants such as a Si oxide or the like collect and accumulate, and to a method of fabricating it.

What is claimed is:

1. A light emitting device comprising:
   a chip for emitting light;
   a protection film formed on an end surface of the chip through which light from the chip is emitted to protect the end surface; and
   a light absorption film formed on a surface of the protection film and absorbing part of the light emitted from the end surface of the chip.
2. The light emitting device according to claim 1, wherein the light absorption film is composed of a palladium oxide.
3. The light emitting device according to claim 1, wherein the protection film has an oxide film composed of an oxide containing at least one element selected from the group of aluminum, titanium, yttrium, silicon, niobium, hafnium, and tantalum.
4. The light emitting device according to claim 1, wherein the protection film has a film containing at least one compound of a nitride of aluminum, a nitride of silicon, an oxynitride of aluminum, and an oxynitride of silicon.
5. The light emitting device according to claim 1, wherein the light absorption film has a metal film composed of metal.
6. The light emitting device according to claim 5, wherein the metal film contains at least one element selected from the group of gold, platinum, rhodium, iridium, osmium, ruthenium, and palladium.
7. The light emitting device according to claim 1, wherein the light absorption film has an oxygen-depleted film which is composed of an oxide containing at least one element selected from the group of aluminum, titanium, zirconium, yttrium, silicon, niobium, hafnium, tungsten, and tantalum and whose composition has less oxygen than its stoichiometric composition.
8. The light emitting device according to claim 1, wherein the light absorption film has a nitride film composed of a nitride containing at least one element selected from the group of aluminum, titanium, zirconium, yttrium, silicon, niobium, hafnium, tungsten, and tantalum.
9. The light emitting device according to claim 1, wherein the chip is a laser chip for emitting laser light.
10. The light emitting device according to claim 9, having a structure in which the chip is not sealed air-tightly.
11. The light emitting device according to clam 10, wherein the chip is disposed in a frame package.
12. The light emitting device according to claim 10, having a structure in which the chip is sealed air-tightly in an HHL package.
13. The light emitting device according to claim 12, wherein the chip is sealed air-tightly together with an adhesive containing an organic matter.
14. The light emitting device according to claim 1, wherein the chip includes a layer composed of a nitride semiconductor.
15. A light emitting device comprising:
    a chip for emitting light; and
    a light absorption film formed on an outermost surface of an end surface of the chip through which light from the chip is emitted and absorbs part of the light emitted from the end surface of the chip,
    wherein the light absorption film is composed of metal and at least part of the light absorption film is an uneven region in thickness, and
    at least part of the light emitted from the end surface of the chip is emitted through at least part of the uneven region.
16. The light emitting device according to claim 15, wherein the uneven region of the light absorption film includes:
    a continuous layer of the metal constituting the light absorption film; and
    a lump composed of the metal and formed on the surface of the layer.
17. The light emitting device according to claim 15, wherein the metal containing at least one metal selected from the group of gold, platinum, rhodium, iridium, osmium, ruthenium, and palladium.
18. The light emitting device according to claim 15, wherein the uneven region of the light absorption film is a discontinuous region in which the light absorption film is discontinuous.
19. The light emitting device according to claim 18, wherein the discontinuous region of the light absorption film includes a lump composed of the metal constituting the light absorption film.
20. The light emitting device according to claim 15, having a structure in which the chip is not sealed air-tightly.
21. The light emitting device according to claim 20, having a structure in which the chip is disposed in a frame package.
22. A light emitting device comprising:
    a chip for emitting light; and
    a metal film made of metal and formed on an outermost surface of an end surface of the chip through which light from the chip is emitted.
23. The light emitting device according to claim 22, wherein at least part of the metal film is a region where the metal constituting the metal film becomes a lump.
24. The light emitting device according to claim 22, wherein the metal film is a continuous layer.

* * * * *